United States Patent [19]
Bloom et al.

[11] Patent Number: 4,556,598
[45] Date of Patent: Dec. 3, 1985

[54] PORCELAIN TAPE FOR PRODUCING PORCELAINIZED METAL SUBSTRATES

[75] Inventors: Terry R. Bloom, Middlebury; John F. Nespor, Elkhart, both of Ind.

[73] Assignee: CTS Corporation, Elkhart, Ind.

[21] Appl. No.: 504,990

[22] Filed: Jun. 16, 1983

[51] Int. Cl.$^4$ ............... B32B 15/00; B32B 15/04
[52] U.S. Cl. ............................. 428/209; 156/89; 428/433; 501/14
[58] Field of Search ............... 156/89; 501/14; 428/209, 433

[56] References Cited

U.S. PATENT DOCUMENTS

| | | | |
|---|---|---|---|
| 3,189,504 | 6/1965 | Whittle et al. | 156/89 |
| 3,293,072 | 12/1966 | Doolittle et al. | 156/89 |
| 3,371,001 | 2/1968 | Ettre | 156/89 |
| 3,506,473 | 4/1970 | Ettre | 156/89 |
| 3,518,756 | 7/1970 | Bennett et al. | 156/89 |
| 4,046,612 | 9/1977 | Warner et al. | 156/89 |
| 4,256,796 | 3/1981 | Hang et al. | 428/210 |
| 4,385,127 | 5/1983 | Chyung | 501/5 |

FOREIGN PATENT DOCUMENTS 2332881  1/1975  Fed. Rep. of Germany ........ 156/89

*Primary Examiner*—Peter Kratz
*Assistant Examiner*—Timothy W. Heitbrink
*Attorney, Agent, or Firm*—Rodger H. Flagg

[57] ABSTRACT

A flexible porcelain tape (10) is manufactured for application to a metal substrate (50) to produce a porcelainized metal substrate (60, 90, 92). The porcelain tape (10) provides an insulative layer (102) upon which can be applied electrical circuits (110) comprising conductive paths (112) and resistors (116), either before or after the porcelain tape (10) is fired. The porcelain tape comprises glass frit (12) blended with a vehicle (11), with volatile gases removed to effect a predetermined viscosity. The mixture (14) is applied evenly to a flexible plastic carrier (16) and dried. The tape (10) may be rolled up and stored until needed, whereupon the flexible carrier (16) is peeled away either before or after the porcelain mixture layer (18) is cut to desired size and configuration. Single or multiple layers of the mixture layer (18) can be disposed upon a metal substrate (50), the combination laminated, and then fired. The resulting single or multiple layer porcelainized metal substrate (60, 90, 92) provides an insulated aluminum, steel, or other metal substrate for supporting electrical circuits thereon.

8 Claims, 6 Drawing Figures

PORCELAIN TAPE FOR PRODUCING PORCELAINIZED METAL SUBSTRATES

DESCRIPTION

TECHNICAL FIELD

The flexible porcelain tape of the present invention may be utilized in the manufacture of porcelainized metal substrates providing an insulative surface for supporting thick film circuits thereon.

BACKGROUND ART

The prior art has provided numerous methods for manufacturing porcelainized metal substrates. These methods comprise spraying a porcelainized mixture upon the metal substrate, drying the mixture and then firing the combination; utilizing electrolytic deposition processes whereby the metal piece is placed within a tank containing a porcelainized mixture and electric current utilized to deposit the mixture onto the surface of the substrate; or conventional screening methods wherein a porcelain mixture is screen printed onto a metal substrate and followed by drying and firing. These prior art processes have proved to be time consuming, expensive and do not readily lend themselves the multilayering of the porcelain mixtures. Thus, there is a need to develop a method for providing a facile manner of handling the porcelain mixture, so that it may be more easily applied to a metal substrate without the use of the time consuming and expensive prior art methods. Also, there is a need for a simplified method of providing for multilayering of porcelain layers whereby selected porcelain mixture layers may support thick film electrical circuits therebetween and the porcelain layers, thick film circuits, and metal substrate may be all fired during a single firing step.

Several prior art methods utilizing ceramic or glass frit tapes have been developed. Doolittle et al. U.S. Pat. No. 3,293,072 issued Dec. 20, 1966 and entitled "Ceramic-Metallizing Tape" describes a method for providing a self-supporting metallizing film as a sealing tape which may be applied to a ceramic surface for the purpose of sealing the surface to the surface of a metal or ceramic element. Ettre U.S. Pat. No. 3,371,001 issued Feb. 27, 1968 and entitled "Method of Applying Uniform Thickness of Frit on Semi-Conductor Wafers" describes the use of a very thin glass layer as a passivation encapsulation, protective and dielectric layer formulation on a semi-conductor wafer. Ettre U.S. Pat. No. 3,506,473 issued Apr. 14, 1970 and entitled "Method of Transferring Glass Frit Image From Transfer Sheet" describes a multilayer transfer tape for transferring a thin glaze, glass or ceramic layer as an insulating layer to a refractory or metal substrate by utilizing only pressure to adhere the tape to the substrate, and pulling away the unadhered sections to form the patterns to be fired. Bennet et al. U.S. Pat. No. 3,518,756 issued July 7, 1970 and entitled "Fabrication of Multilevel Ceramic, Microelectronic Structures" describes the manufacture of multilayer ceramic microelectronic structures having metallized patterns and metallized through holes, the ceramic layers being punched and pressed together before firing. The above patents all deal with the formulation of ceramic or glass tapes for effecting the respective objects specified in the issued patents, but none of the patents describe a process suitable for utilizing a flexible porcelain tape to provide a porcelainized metal substrate, particularly a porcelainized metal substrate suitable for supporting a thick film electrical circuit thereon.

DISCLOSURE OF THE INVENTION

The flexible porcelain tape is manufactured by first blending together a glass frit and vehicle mixture, the vehicle comprising a combination of solvents and binder material. The fluid glass frit-vehicle mixture may be subjected to a vacuum to remove volatile gases therefrom and effect a desired viscosity. A flexible plastic carrier is stretched over a flat surface and the fluid mixture spread evenly upon the flexible plastic carrier to provide an even, continuous layer of mixture. The glass frit-vehicle mixture is dried, which adheres the mixture to the underlying flexible carrier and form the porcelain tape. If the porcelain tape is not to be used immediately, it may be simply rolled and placed in sealed containers until it is to be used. The flexible porcelain tape may be cut to the desired configuration of the substrate to which it is to be applied, with the flexible plastic carrier being removed either prior to or after the cutting or forming operation. Once the flexible plastic carrier is removed, the glass frit-vehicle mixture layer is disposed upon a metal substrate, and the combination placed within a lamination press. After lamination, the laminated mixture layer and substrate are fired to melt and bond the glass frit mixture to the substrate and produce a porcelainized metal substrate. The porcelain layer bonded to the metal substrate provides an insulative layer disposed over the metal substrate which may serve as a heat sink, and thick film circuits comprising conductive and resistive patterns may be applied to the porcelain insulative layer.

The method and resulting article of the present invention also provide for the manufacture of multilayer porcelain substrates. A single layer or multiple layers of porcelain mixture with the flexible plastic carrier removed therefrom, may be disposed on a substrate, the subsequent second and third mixture layers being disposed one upon the other. After the lamination step in which the layer or multiple mixture layers are laminated to the metal substrate, a conductive paint may be printed in a conductive pattern on the top porcelain mixture layer and then dried. Next, a resistor paint may be screen printed in a pattern overlapping portions of the conductive pattern, and subsequently dried. Then another formed porcelain mixture layer is disposed over the top porcelain mixture layer with the thick film circuit disposed therebetween and laminated to the top layer, followed by the entire combination being fired in a one step firing process. Thus, multiple layers of porcelain mixtures each provided from a flexible porcelain tape, can be stacked one upon another over the subsequent substrate with thick film circuits disposed between laminated adjacent layers of porcelain mixtures, and then the entire combination fired in a single firing step wherein the resulting fired thick film circuits are protectively disposed between two porcelain layers intimately bonded one to another and the substrate. This, of course, protects the printed thick film circuits during firing from oxidation, both during the firing process and afterwards when the overlying fired porcelain mixture layer comprises an insulative porcelain layer. Alternatively, a printed thick film circuit not subject to the effects of oxidation need not have a porcelain mixture layer disposed thereover and may comprise the top most layer of the construction. In any of these methods, thick film conductive circuits may be screened onto the overlying porcelain layer or layers after the firing step, and then fired in another step.

The method for producing the flexible porcelain tape provides a porcelain material that is easily handled, formed and applied to a metal substrate whereby the flexible porcelain mixture can be formed to the exact shape of the corresponding metal substrate. Equally important is the ability to readily manufacture multilayer porcelainized metal substrates wherein the thick film electrical circuits may be disposed between protective insulative porcelain layers or upon the top of a plurality of insulative porcelain layers to provide superior insulative separation and high dielectric strength between the circuits and subjacent metal substrate.

BEST MODE FOR CARRYING OUT THE INVENTION

Figure 1:
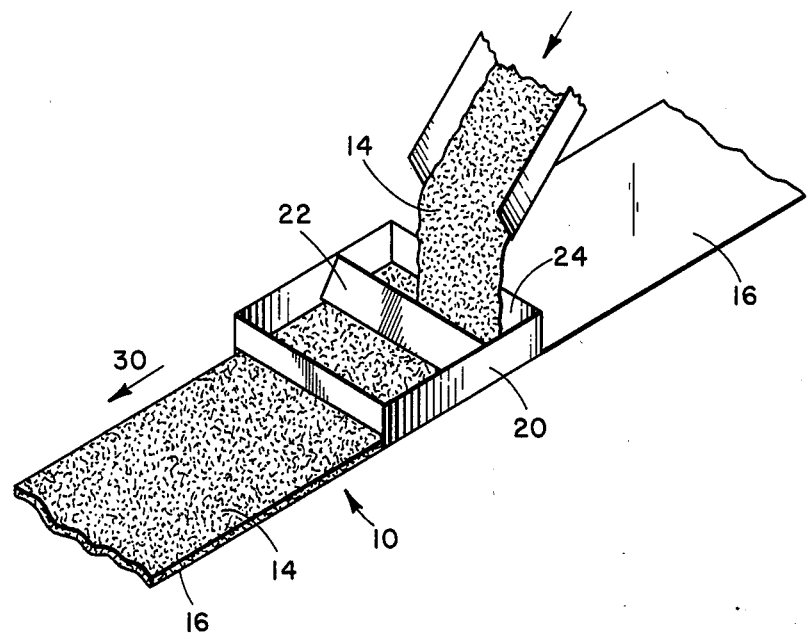
FIG. 1 is a schematic representation of the glass frit-vehicle mixture of the present invention being applied in an even layer to a flexible carrier.

Referring now to the drawings, and particularly FIGS. 1-4, the porcelainized tape of the present invention is designated generally by reference numeral 10. Flexible porcelain tape 10 is manufactured by first mixing together a vehicle 11 and glass powder 12 to provide a fluid glass frit mixture 14. The glass powder 12 and vehicle 11 may be blended and mixed together in a ball mill as indicated in the first processing step illustrated in FIG. 3. The ball mill should be cleaned with acetone or other cleaner in order to insure that there is no water in the mill because some glass frit mixtures tend to be hygroscopic. Fluid glass frit mixture 14 may be placed in a sealed container and stored until needed, and preferably stored on a rolling storage apparatus which will prevent separation of the glass frit and vehicle. In order to cast fluid frit mixture 14, a flexible plastic film such as polyethylene is disposed over a flat surface. The polyethylene film may be typically three mils thick and comprise any of a number of flexible plastic films suitable for this use. It should be understood that a particular type of film is not critical to the invention described herein. The fluid glass frit mixture 14 should be prepared for application to the flexible carrier 16 by effecting a proper viscosity. This may be done by precisely mixing and controlling the constituents of vehicle 11 mixed with glass powder 12 in order to provide the desired viscosity, or the fluid glass frit mixture 14 may be subjected to a vacuum in order to draw off volatile gases and produce the desired viscosity. Typically, it has been found that sixteen ounces of the fluid glass frit mixture 14 may be subjected to a vacuum for approximately two minutes in order to aid in the solidification of the slurry and provide the desired viscosity.

The fluid glass frit mixture 14 is applied to flexible carrier 16 as shown in FIG. 1 by means of a "doctor blade" device 20. The doctor blade device 20 includes an adjustable doctor blade 22 located therein whereby glass frit mixture 14 is poured into the front cavity 24 while flexible carrier 16 is advanced in the direcion of arrow 30. Doctor blade 22 applies the glass frit mixture 14 evenly to carrier 16 in order to provide a continuous, controlled thickness of mixture 14 on carrier 16. The thickness of applied glass frit mixture 14 is approximately five to seven mils and is allowed to dry on the carrier for several hours.

Figure 2:
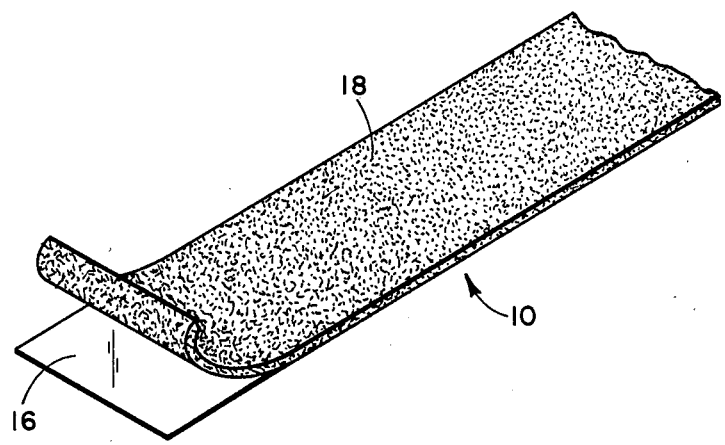
FIG. 2 is an illustration of the flexible porcelain tape comprising the flexible carrier with the layer of glass frit-vehicle mixture disposed thereon.

The flexible porcelain tape 10 produced by this process and illustrated in FIG. 2 may be used immediately in further processing applications to provide a porcelainized metal substrate, or simply rolled up and stored in sealed containers until needed. Flexible porcelain tapes 10 are stored in sealed containers in order to prevent the further outgassing of volatile gases from frit vehicle mixture layer 18, such outgassing causing the mixture to become brittle and difficult to handle in later processing steps. As illustrated in FIG. 2, the flexible porcelain tape comprises the dried glass frit-vehicle mixture layer 18 and underlying flexible plastic carrier 16. The glass frit-vehicle mixture layer adheres lightly to carrier 16 which may be quite easily peeled away or removed from the mixture 18. It should be clearly understood that flexible porcelain tape 10 may be cut to a desired configuration either prior to or after the removal of flexible carrier 16. In other words, the frit-vehicle mixture layer 18 may be peeled from the carrier 16 and then formed or cut to the desired configuration of the corresponding metal substrate, or tape 10 comprising frit-vehicle mixture layer 18 and carrier 16 may be cut to the desired configuration and then carrier 16 peeled away before mixture layer 18 is applied to the metal substrate. This is illustrated in FIG. 3 wherein the processing step of removing the flexible carrier is shown as a step accomplished either prior to or after the cutting or forming of frit-vehicle mixture layer 18.

After flexible frit-vehicle mixture layer 18 is cut or formed and carrier 16 removed, the next step in producing a porcelainized metal substrate is to place the formed flexible mixture layer 18 over the complementarily shaped metal substrate. The metal substrate 50 is placed on the bottom plate of a lamination press, with flexible mixture layer 18 disposed upon the substrate. In order to insure that the flexible mixture layer 18 does not adhere to the upper portion of the press after the lamination operation, a Teflon ® sheet of approximately five mil thickness may be disposed over layer 18 and a stainless steel plate placed over the Teflon ® sheet. Alternatively, the stainless steel plate may be sprayed with Teflon ® to insure nonsticking. If the lamination press is a high quality press, then the press surface may be simply sprayed with Teflon ® to insure that there will be no sticking of mixture layer 18 after lamination. Mixture layer 18 and metal substrate 50 are maintained in the lamination press for several minutes at an approximate press temperature of 220° F. and a pressure of approximately 5,000-6,000 pounds pr square inch.

Figure 3:
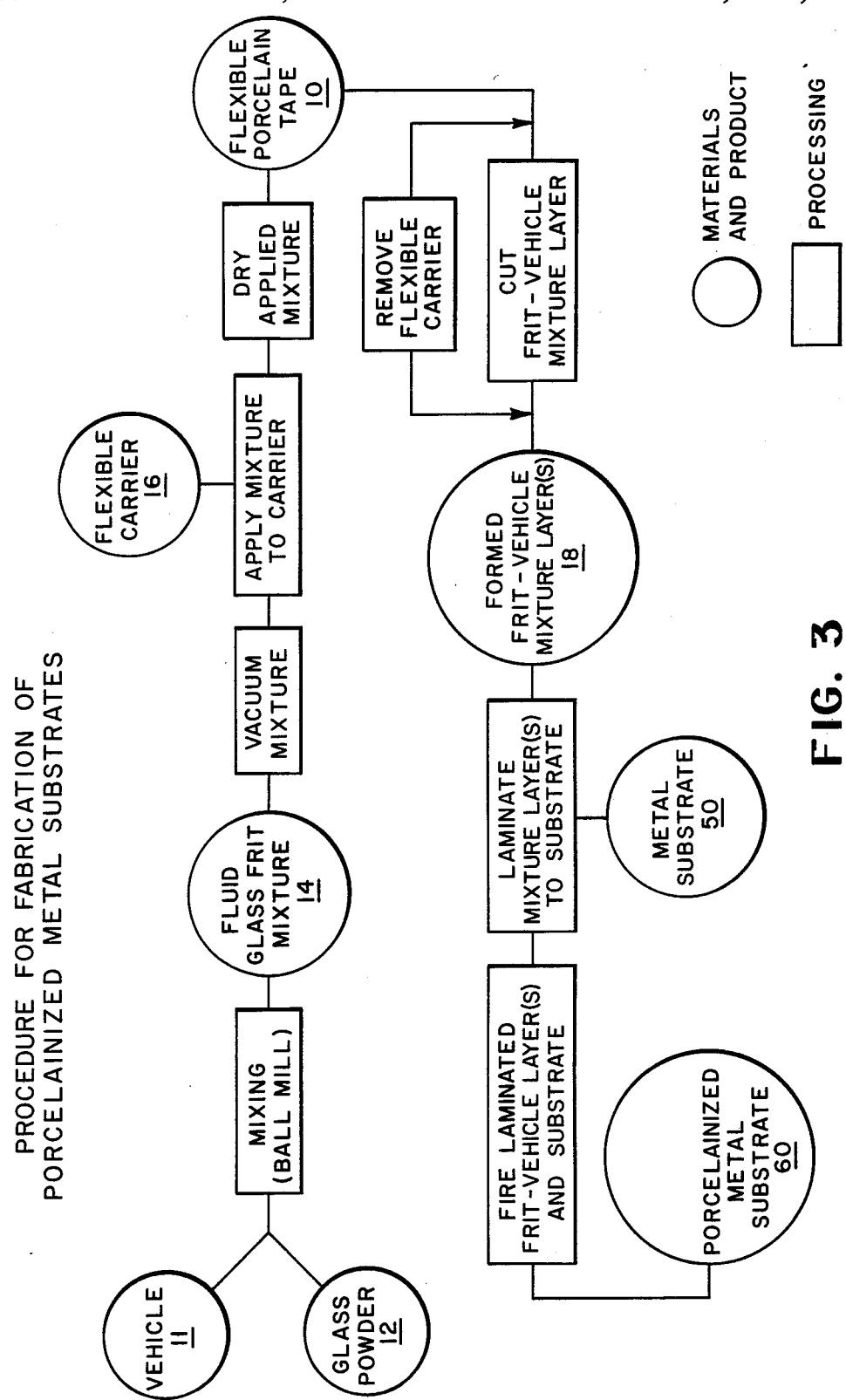
FIG. 3 is a flow diagram of the process utilizing the present invention to form a porcelainized metal substrate.

When the lamination step illustrated in FIG. 3 is completed, the metal substrate 50 with laminated layer 18 is removed from the press and placed in a firing kiln. Prior to firing, the edges of laminated layer 18 may be filed or beveled back from the edge of the substrate, which assists in preventing the edges from peeling away from the substrate due to the affects of viscosity. Any firing kiln suitable for a particular application may be utilized, and the firing temperatures will vary according to the specific application and materials used. The firing is at a temperature sufficiently above the softening point of the glass in order to melt the glass and bond it to the underlying metal substrate and produce porcelainized metal substrate 60. Typical firing temperatures are a 520° C. peak firing temperature for a porcelainized aluminum substrate and approximately 790° C. for a porcelainized steel substrate.

To manufacture a multilayer porcelainized metal substrate comprising multiple layers of mixture layer 18 laminated and fired on metal substrate 50, two or more mixture layers 18 (see FIG. 3) are placed one over another on top of the metal substrate. The lamination press may be sprayed with Teflon ® in order to prevent sticking, or the other alternative methods utilized. Metal substrate 50 with multiple mixture layers 18 disposed thereon, is placed in a lamination press for several minutes at approximately 200° F. and a pressure of approximately 10,000 pounds per square inch. After lamination, the firing may be at a temperature appropriate for the particular metal substrate and application, such as approximately 520° C. for an aluminum substrate and approximately 790° C. for a steel substrate.

Figure 4:
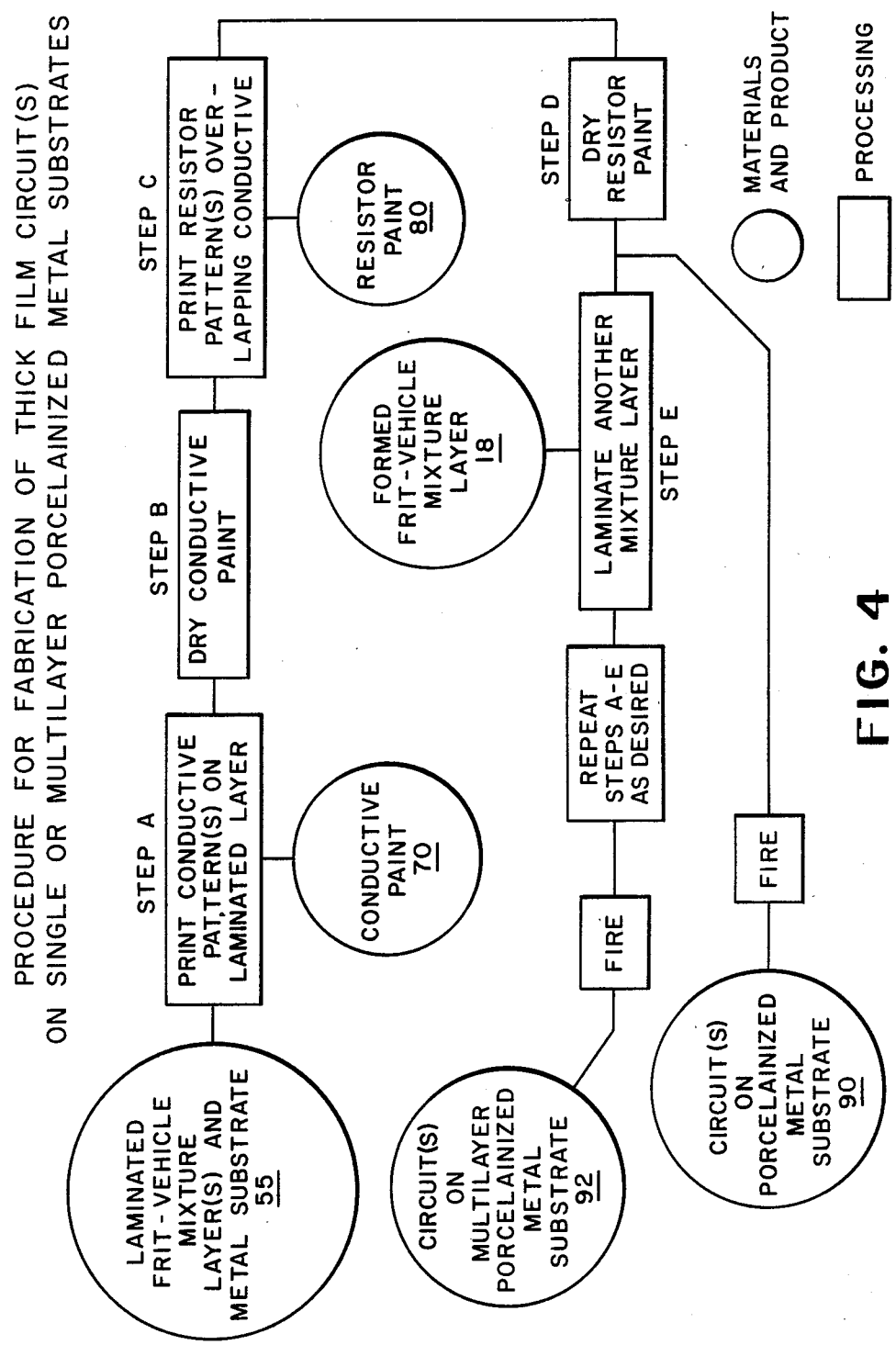
FIG. 4 is a flow diagram of the process utilizing the present invention to provide a single or multilayer porcelainized metal substrate supporting a thick film electrical circuit thereon.

The method for producing porcelainized metal substrates with a thick film electrical circuit(s) disposed thereon, follows the steps illustrated in the flow diagram of FIG. 4. This process begins with either one or more layers of mixture layer 18 laminated to the metal substrate 50 providing an intermediate laminated metal substrate 55. A conductive paint 70 is printed upon the surface of the lamination layer (see Step A of FIG. 4) by screening methods well known in the art, and then the conductive paint 70 is dried, (Step B). Resistor paint 80 is then screen printed in overlapping relationship with the conductive pattern or patterns, thereby forming a resistor pattern located on the lamination with the resistors overlapping portions of the previously printed and dried and conductive patterns. After the printing of the resistor pattern or patterns as illustrated by Step C, the resistor paint is dried (Step D) and then the combination fired to produce a thick film circuit or circuits disposed on the porcelainized metal substrate 90. This single firing technique obviates further processing steps and reduces the overall energy expenditure of the process, and may be utilized when the conductive and resistive paints are air fireable. It should be understood that Steps A and B and Steps C and D are interchangeable, that is, either the conductive pattern or the resistor pattern can be printed before the other.

As illustrated by Step E, another formed frit-vehicle mixture layer 18 may be disposed over the thick film electrical circuit and laminated layer(s) of intermediate product 55. The additional mixture layer 18 is laminated over the thick film circuit, and then Steps A-E may be repeated if another thick film electrical circuit is to be disposed on the top lamination layer (see FIG. 6), and repeated as many times as desired in order to continue the stacking arrangement. Finally, the entire combination is fired in a single firing step whereby the thick film electrical circuit or circuits disposed between adjacent laminated layers of frit-vehicle mixtures are fired simultaneously with the laminated layers. The combination is heated to a temperature in excess of the softening point of the glass frit to effect melting of the glass frit and bonding of one layer to another to form the thick film circuit multilayer porcelainized metal substrate 92.

Figure 5:
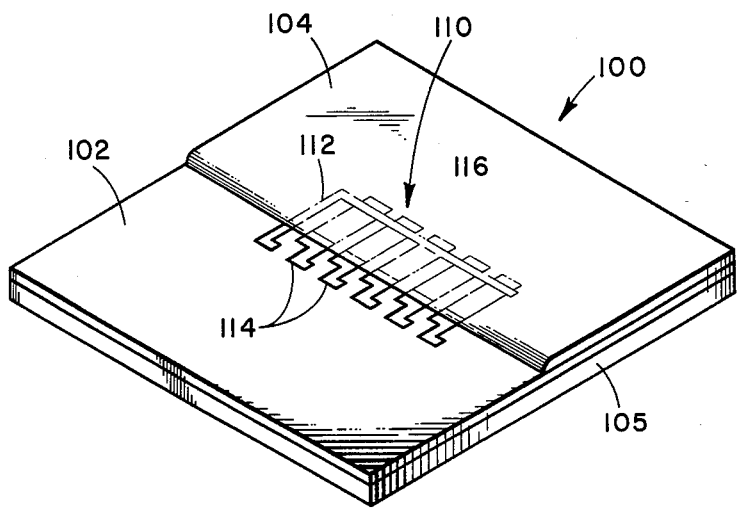
FIG. 5 is an isometric view of a porcelainized metal substrate supporting a thick film electrical circuit and manufactured in accordance with the present invention; and, FIG. 6 is a schematic representation of a section view of a multilayer porcelainized substrate manufactured in accordance with the present invention.

Referring to FIG. 5, there is illustrated in isometric view a multilayered porcelainized metal substrate 100 comprised of metal substrate 105, porcelain layers 102 and 104, and a thick film electrical circuit indicated generally by reference numeral 110. Thick film electrical circuit 110 comprises conductor path 112, conductive pads 114, and resistors 116. Thick film electrical circuit 110 is disposed between porcelain layers 102 and 104.

Figure 6:
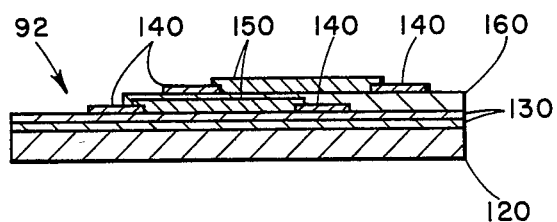

FIG. 6 is a schematic representation of a section view of the multilayer porcelainized metal substrate 92 of FIG. 4. Disposed on substrate 120 are two porcelain layers 130, conductor paths 140, resistors 150, and intermediate porcelain layer 160. The top most thick film circuit also may be covered by a porcelain layer 130 if the circuit requires protection from the effects of oxidation.

A thick film electrical circuit may be disposed on a fired porcelainized metal substrate. After the firing step in which the laminated glass frit-vehicle mixture layer 18 is melted and bonded to the underlying metal substrate, a thick film electrical circuit may be printed upon the porcelainized surface. After printing of the circuit is completed, the combination may be fired. This process is particularly useful where oxidation is not deleterious to components of the circuit. Of course, the circuit may be fired in a protective atmosphere in order to avoid oxidation, by utilizing methods well known in the art. Thus, the process providing a multilayer porcelainized metal substrate having thick film electrical circuits supported on the porcelain layers, either on top of the upper most porcelain layer or between adjacent porcelain layers, may be modified for specific applications wherein oxidation of the circuit components is to be avoided, oxidation is not critical, or a protective atmosphere is utilized.

Additionally, circuits other than thick film circuits may be utilized with the porcelainized metal substrates of the present invention. Solid metal runs, either cut in pattern form or made by chemical etching techniques well known in the art, have been disposed on the laminated layer prior to firing, and thin film circuits may be disposed on the fired porcelain layer by well known techniques. It should be understood that a number of alternative steps in these processes may be utilized for the particular applications, and each is well within the scope of the invention disclosed herein.

SELECTED WORKING EXAMPLES

Commercial glass compositions available from Ferro Corporation, Cleveland, Ohio, or another glass composition are suitable for use. Referring to Table I, the three types of glass utilized are glass A having the constituents listed, and glasses B and C identified as EL 50 and EL 2020, respectively, both being commercially available glasses manufactured by Ferro Corporation. Glass A is prepared by mixing the constituents in a twin shell for approximately 30 minutes and then pouring the mixture into a standard clay crucible for firing at approximately 1,100° C. The frit is dripped twice and then ball milled for approximately four hours in acetone to produce glass frit A.

TABLE I

| Glass Frit Compositions (By Weight) | | | |
|---|---|---|---|
| Glass Constituent | Glass A | Glass B | Glass C |
| $Pb_3O_4$ | 31 | EL50 | EL2020 |
| $SiO_2$ | 25 | Both EL50 and EL2020 | |
| $AL_2O_3$ | 4 | available from | |
| $Na_2CO_3$ | 15 | Ferro Corporation, | |
| $K_2CO_3$ | 11 | Cleveland, Ohio | |
| $Li_2CO_3$ | 5 | | |
| $TiO_2$ | 9 | | |

TABLE II

| Tape (Glass Frit-Vehicle) Compositions (By Weight) for Aluminum Substrates | | | | |
|---|---|---|---|---|
| Mixture | Tape A | Tape B | Tape C | Tape D |
| Glass A | 57.3 | 59.6 | 62.3 | |
| Glass B | | | | 59.6 |
| Methyl ethyl ketone | 5.1 | 5.4 | 5.6 | 5.4 |
| Toluene | 11.5 | 11.9 | 12.5 | 11.9 |
| Acetone | 7.2 | 7.5 | 7.8 | 7.5 |
| Phthalate Plasticizer | 1.4 | 1.4 | 1.5 | 1.4 |
| Silicon Leveling Agent | 0.3 | 2.2 | 0.3 | 2.2 |
| Acrylic Binder | 17.2 | 13.9 | 10.0 | 13.9 |

The porcelain tape comprises a glass frit blended with a vehicle, the vehicle comprising solvents and binders. Table II illustrates four tape compositions suitable for manufacturing porcelainized aluminum substrates. The vehicle comprises a combination of the solvent constituents (the methyl ethyl ketone, toluene and acetone) and binder constituents (plasticizer, silicon leveling agent, and acrylic binder). The phthalate plasticizer may be obtained from Monsanto Corporation and is sold under the product name of Sanicizer 261; the silicon leveling agent is a Dow Corning product identified as DC No. 3; and the acrylic binder is a Rohm & Haas Corporation product identified as Acryloid B7. Table II illustrates the proportions of glass frits comprising glass A and glass B mixed with the vehicle to provide procelain tapes A-D.

After lamination to an aluminum substrate, the tape and substrate are fired at approximately 500° C. in a Harrop kiln operating at five inches per minute and with a preheat of approximately 300° C. Tape B was found to be the best and most useful tape for porcelainized aluminum substrates, and Table III illustrates the results of a voltage breakdown test applied to one or more layers of porcelain tape B on an aluminum substrate. The voltage breakdown test is conducted by applying a voltage to a conductive patch disposed on the porcelain. Typically, the conductive composition may comprise, by weight, silver (79.5%), a commercial glass (8.2%) sold as XG29 by Drakenfeld Corporation, and a typical screening agent (12.3%). The conductive patch is printed on the porcelain surface and heated in a Harrop kiln at 500° C., the kiln operating at 12 inches per minute. A voltage is applied directly to the conductive patch and increased until the current arcs through the porcelain to the underlying substrate. Excellent results were found by utilizing a triple porcelain layered aluminum substrate manufactured from two lower layers of tape D with an overlying layer of tape B, which withstood a voltage surge of 4,000 volts DC.

TABLE III

| Voltage Breakdown Test for Porcelainized Aluminum Substrate (Tape B) | |
|---|---|
| Tape B Number of Porcelain Layers | Voltage (DC) |
| 1 | 2250 |
| 2 | 2800 |
| 3 | 4000 |
| 4 | >4000 |

Triple layered porcelainized aluminum substrates were tested and the results are illustrated in Table IV. The triple layered porcelainized aluminum substrates were made from three layers of tape B, and from two layers of tape D with one overlying layer of tape B.

TABLE IV

| Triple Layer Porcelainized Aluminum Substrates | | |
|---|---|---|
| | Layers: | |
| Test | Three of Tape B Result | Two of Tape D, One of Tape B Result |
| 10 day mil. Humidity @ 100 VDC | Good | Good |
| −55° C. to +125° C. Thermal Shock | Good | Satisfactory |
| 48 hrs. @ 200° C. | Good | |
| 250 hrs. @ 200° C. & 100 VDC | Good | |
| 250 hrs. @ 200° C. & 200 VDC | | Good |
| 250 hrs. @ Room Temperature & 1,000 VDC | | Good |

The glass frit and vehicle constituents of tape E utilized for steel substrates are illustrated in Table V. After lamination of tape E to the steel substrate, the combination was fired at approximately 790° C. for 20 minutes to produce a porcelainized steel substrate. Multilayer porcelainized steel substrates are easily produced by the present invention, and the results of tests applied to a porcelainized steel substrate having two layers of tape E, are illustrated in Table VI.

TABLE V

| Tape Composition (By Weight) for Steel Substrates | |
|---|---|
| | Tape E |
| Glass C | 59.6 |
| Methyl ethyl ketone | 5.4 |
| Toluene | 11.9 |
| Acetone | 7.5 |
| Phthalate Plasticizer | 1.4 |
| Silicon Leveling Agent | 0.3 |
| Acrylic Binder | 13.9 |

TABLE VI

| Double Layer Porcelainized Steel Substrates | |
|---|---|
| Test | Two Layers of Tape E |
| Voltage Breakdown | ≦4000 VDC |
| 10 day mil. Humidity | Good |
| −55° C. to +125° C. Thermal Shock | Good |
| 250 hrs. @ 300° C. | Good |
| 250 hrs. @ room temperature + 1000 VDC | Good |

One of the important uses of the present invention is the provision of a metal substrate which serves as a heat sink with an insulative porcelain layer disposed thereover for supporting a thick film electrical circuit. It has been found that thick film electrical circuits may be printed on the top layer of laminated porcelain tape and the circuit and tape all fired in a single firing step, or that the thick film electrical circuit may be disposed between adjacent layers of laminated porcelain tape and a single firing step utilized to melt the glass frit mixture and produce the multilayer porcelainized metal substrate as illustrated in FIG. 5. This is particularly useful where the thick film electrical circuit is to be protected from oxidation. The present invention may be utilized for producing multilayer porcelainized metal substrates with thick film electrical circuits disposed on the top layer or between adjacent layers of porcelain.

Table VII illustrates a conductive and resistive utilized for providing a thick film electrical circuit on a laminated glass frit-vehicle layer prior to a single firing which produces the porcelainized metal substrate supporting the fired thick film electrical circuit.

TABLE VII

| Thick Film Materials for Multilayer Porcelainized Metal Substrates | |
|---|---|
| Conductive Constituent | % By Weight |
| Screening Agent | 12.30 |
| Glass Frit with Softening Point of 540° C. | 6.56 |
| $AL_2O_3$ | 1.64 |
| Pd | 13.00 |
| Pt | 5.00 |
| Ag | 61.50 |
| Resistive | |
| Screening Agent | 69.3 |
| Glass Frit with Softening Point of 540° C. | 14.2 |
| $AL_2O_3$ | 5.7 |
| $RuO_2$ | 10.8 |

OPERATION

In operation, glass frit powder 12 is first mixed with a vehicle 11 to provide the fluid glass frit mixture 14 which is applied to a flexible carrier 16 and dried. This produces flexible porcelain tape 10 comprising glass frit-vehicle mixture 18 adhered to flexible carrier 16. Flexible carrier 16 is removed from frit-vehicle mixture layer 18, either before or after forming or cutting of mixture layer 18, and then mixture layer 18 is placed over a complementary shaped metal substrate 50 in a lamination press. Mixture layer 18 is laminated to metal substrate 50 and then the combination fired to produce porcelainized metal substrate 60. Multilayer porcelainized metal substrates 90, 92 are produced by laminating a layer or layers or formed frit-vehicle mixture layers 18 onto the metal substrate, printing conductive paint 70 in a pattern on the top laminated mixture layer, drying the conductive pattern, printing resistor paint 80 in a pattern on the top laminated mixture layer so that it overlaps portions of the conductive pattern, drying the resistor paint, and then either firing the combination to provide multilayer porcelain metal substrate 90 or laminating another formed frit-vehicle mixture layer 18 over the thick film electrical circuit and then firing to produce multilayer porcelainized metal substrate 92.

INDUSTRIAL APPLICABILITY

This invention is used for producing single or multilayered porcelainized metal substrates.

CONCLUSION

Although the present invention has been illustrated and described in connection with example embodiments, it will be understood that this is illustrative of the invention, and by no means restrictive thereof. It is reasonably to be expected that those skilled in the art can make numerous revisions and additions to the invention and it is intended that such revisions and additions will be included within the scope of the following claims as equivalents of the invention.

We claim:

1. A porcelainized metal substrate, comprising an insulative glass layer bonded to said metal substrate, said insulative glass layer and metal substrate comprising the conjoint product of a mixture of glass frit and vehicle dried on flexible carrier tape, the mixture removed from said carrier tape, and adhered to said metal substrate by heated pressing, said metal substrate and insulative glass layer being the conjoint reaction product of firing said mixture and substrate to melt and bond said mixture to said substrate subsequently to said pressing.

2. The porcelainized metal substrate in accordance with claim 1, wherein the metal substrate comprises an aluminum substrate and said firing occurs at approximately 520° C.

3. The porcelainized metal substrate in accordance with claim 1, wherein said metal substrate comprises a steel substrate and said firing occurs at approximately 790° C.

4. The porcelainized metal substrate in accordance with claim 1, further comprising another mixture layer wherein said insulative glass layer and substrate comprise the conjoint reaction product of at least two layers of mixture removed from said carrier means and disposed one upon the other, heat pressed with said metal substrate, and the mixture layers and metal substrate subsequently fired.

5. A procelainized metal substrate supporting an electrical circuit thereon, comprising an insulative glass layer bonded to said metal substrate, said insulative glass layer and metal substrate comprising the conjoint product of a mixture of glass frit and vehicle dried on flexible carrier tape, the mixture removed from said carrier tape and adhered to said metal substrate by heated pressing, said electrical circuit being the product of disposing conductive and resistive patterns on said mixture layer subsequently to said heated pressing, and said metal substrate, insulative glass layer, and electrical circuit being the conjoint reaction product of firing said mixture, substrate, and electrical circuit to melt and bond said mixture to said substrate subsequently to said pressing.

6. The porcelainized metal substrate with electrical circuit in accordance with claim 3, wherein said insulative glass layer comprises the product of at least two layers of mixture adhered to the metal substrate by heated pressing.

7. The porcelainized metal substrate with electrical circuit in accordance with claim 3, wherein said insulative glass layer comprises the product of at least two layers of mixture adhered to the metal substrate by heated pressing.

8. A procelainized metal substrate supporting an electrical circuit thereon, comprising an insulative glass layer bonded to said metal substrate, said insulative glass layer and metal substrate comprising the conjoint product of a mixture of glass frit and vehicle dried on flexible carrier tape, the mixture removed from said carrier tape and adhered to said metal substrate by heated pressing, and said electrical circuit being the product of disposing conductive and resistive patterns on said porcelain subsequently to said firing.

* * * * *